United States Patent
Nguyen et al.

(10) Patent No.: US 7,490,306 B2
(45) Date of Patent: Feb. 10, 2009

(54) SUB-SYSTEM POWER NOISE SUPPRESSION DESIGN PROCEDURE

(75) Inventors: Son N. Nguyen, Irvine, CA (US); Harry J. McIntyre, Los Angeles, CA (US)

(73) Assignee: Xerox Corporation, Norwalk, CT (US)

( * ) Notice: Subject to any disclaimer, the term of this patent is extended or adjusted under 35 U.S.C. 154(b) by 473 days.

(21) Appl. No.: 11/278,462

(22) Filed: Apr. 3, 2006

(65) Prior Publication Data
US 2007/0234245 A1    Oct. 4, 2007

(51) Int. Cl.
G06F 17/50    (2006.01)
G06F 9/45    (2006.01)
G06F 9/455    (2006.01)

(52) U.S. Cl. .................... 716/5; 716/8; 716/9; 716/10; 716/11

(58) Field of Classification Search ............... 716/8–11, 716/5
See application file for complete search history.

(56) References Cited

U.S. PATENT DOCUMENTS

2002/0169590 A1*  11/2002  Smith et al. ............... 703/18
2003/0222655 A1*  12/2003  Gauthier et al. ............ 324/601
2004/0088661 A1*  5/2004  Anderson et al. .......... 716/5

* cited by examiner

Primary Examiner—Jack Chiang
Assistant Examiner—Suresh Memula
(74) Attorney, Agent, or Firm—Oliff & Berridge, PLC

(57) ABSTRACT

Aspects of the disclosure provide methods and systems to design a distributed discrete capacitor bank incorporating power plane capacitance to concentrate the suppression of AC coupling to the frequencies caused by clocks and signal transitions. Aspects of the disclosure provide a procedure for designing a distributed capacitor bank from a combination of bulk capacitors, ceramic capacitors and/or plane capacitance that provides the desired impedance Z to suppress noise at all desired frequencies.

18 Claims, 7 Drawing Sheets

US 7,490,306 B2

SUB-SYSTEM POWER NOISE SUPPRESSION DESIGN PROCEDURE

BACKGROUND

Methods and systems for sub-system power noise suppression design provide a systematic approach to design of an optimal printed wiring board assembly that suppresses system noise.

Electronic data rates of printed wiring board assemblies (PWBAs) have passed into the gigahertz range. As switching speeds increase, there are ever more demands on power management to maintain core voltage stability and suppress switching noise on the power supply lines. The quickened signal transition times cause noise along a wide frequency range on the power lines and result in unacceptable levels of electromagnetic interference (EMI) and signal integrity degradation. As a result, power systems must be designed to compensate for these problems to meet current EMI regulations and maintain signal integrity.

Within a printed wiring board assembly, DC-to-DC converters are used to create a sub-system power source isolated from the main power system. However, this isolated power source is still a power system and must itself suppress noise. Power supply design is evolving and many theories have advanced to address problems. The traditional approach to this problem has been to provide a decoupling capacitance which strongly AC and/or DC couples noisy power lines to a ground and/or a power supply. This has been achieved by providing the wiring board with the addition of numerous discrete decoupling capacitors or the addition of a box filter. However, conventional methods have relied on a trial-and-error testing to find a suitable suppression solution or used off-the-shelf computer programs that provide some guidance, but sub-optimal performance and reliability. The trial-and-error methodology is time-consuming, difficult to achieve an optimized result, and costly.

There is a need for an improved, cost-effective and time-saving process to design a power supply that achieves sufficient power supply noise suppression and signal integrity.

SUMMARY

In accordance with various aspects, a procedure is described for designing a distributed capacitor bank delivering impedances below a specified "Target Impedance" over a wide bandwidth to suppress electronic switching noise, resulting from a clocking frequency, on the distribution lines of a supply voltage provided by a power supply in a power supply system.

In accordance with additional aspects, the procedure: determines an aggregate capacitance $C_{LOAD}$ for each electrical circuit driven by the same power supply and operated at the same clock frequency; determines a maximum transient current $I_{MAX}$ for the power supply; determines a target impedance $Z_T$ for the power supply; identifies a fundamental frequency $F_{FUND}$ corresponding to the clock rate, the third harmonic $F_{3rd}$, and a high frequency noise $F_H$ correlated to an edge transition time; plots the identified frequencies on an impedance vs. frequency chart along with the target impedance $Z_T$; determines a capacitor component C1, C2 and C3 with a resonant frequency corresponding to each of the frequencies $F_{FUND}$, $F_{3rd}$, and $F_H$ and plotting capacitors C1, C2 and C3 onto the impedance vs. frequency chart; determines the plane capacitance $C_{PLANE}$ for the size and particular board material used for the power supply and electrical circuit and plotting $C_{PLANE}$ on the impedance vs. frequency chart; determines the multiples of C1, C2 and/or C3 needed to support the capacitance $C_{LOAD}$; analyzes intersecting points of the capacitor component frequency plots for C1, C2, C3 and $C_{PLANE}$ to determine whether all intersecting points occur below the target impedance $Z_T$; and determines that a distributed capacitor bank from the identified capacitor components is viable to suppress noise on the supply voltage's power lines to within the electronics' operational specifications if all intersecting points occur below target impedance $Z_T$.

In accordance with additional aspects, the procedure is repeated for each power supply on the printed wiring board assembly, and for each power supply, repeated for each group of electronics driven at the same clock frequency.

In accordance with further aspects, the procedure is implemented in software in a system for determining and outputting an acceptable distributed capacitor bank design.

BRIEF DESCRIPTION OF THE DRAWINGS

Various disclosed exemplary embodiments of the systems and methods will be described in detail, with reference to the following figures, wherein.

DETAILED DESCRIPTION OF EMBODIMENTS

Figure 1:
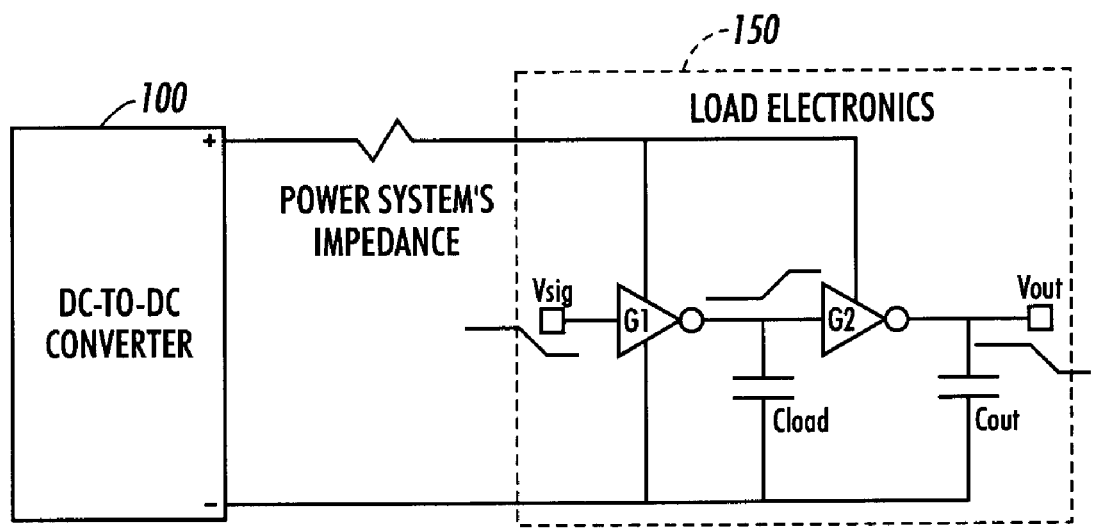
FIG. 1 shows a diagrammatic representation of a DC-to-DC converter powering a couple of gates through a power system's impedance.
Figure 2:
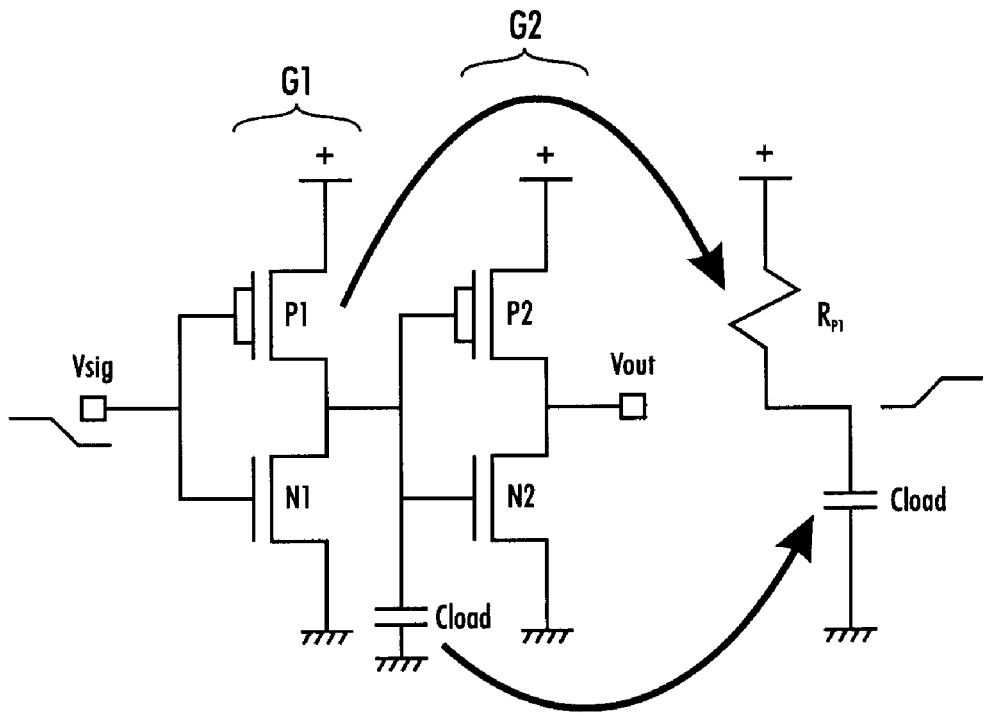
FIG. 2 shows a diagrammatic representation of the charging of an input capacitance $C_{LOAD}$ through an ON resistance $R_{P1}$.

Noise on the power line of electronics circuits is induced by the switching of the load electronics. FIG. 1 shows a DC-to-DC converter 100 powering a couple of gates G1, G2 through the power system's impedance Z. When the signal $V_{SIG}$ transitions from high to low, the input capacitance, $C_{LOAD}$, to gate G2 gets charge from 0 Volts to the power supply voltage. The charging occurs through the channel resistance $R_{P1}$, of P1 in gate G1 as shown in FIG. 2. Typical transition speeds are 1 ns and typical input capacitances are 10 pF yielding 35 µA charging current, assuming 3.5 volts. Typical electronics consist of hundreds of thousands of gates, all switching on a rising clock edge generating tens of amps of current. The resulting load current spikes at the clock transitions and is otherwise resting.

Power systems must be designed to provide large transient currents with little variation in the supply voltage delivered. The subsystem electronics shown in FIG. 3 consist of a DC-to-DC converter 100 that supplies power to electronics 150 (the load) through an impedance Z. The impedance Z is a combination of DC and AC coupling to the DC-to-DC converter's +and−power terminals. The load electronics 150 may draw a transient current as high as $I_{MAX}$ through impedance Z, generating voltage $V_Z$, where $V_Z = I_{MAX} * Z$. The voltage at the load, $V_{LOAD}$, is $V_{LOAD} = V_{DC} - I_{MAX} * Z$.

The impedance Z must be kept low enough such that the DC-to-DC converter voltage $V_{DC}$ lessened by $V_Z$, does not cause $V_{LOAD}$ to fall below the minimum operating supply voltage of the load, $V_{MIN}$. The maximum impedance for Z, referred to as "target impedance," is $Z_T = (V_{DC} - V_{MIN})/I_{MAX}$.

Figure 4:
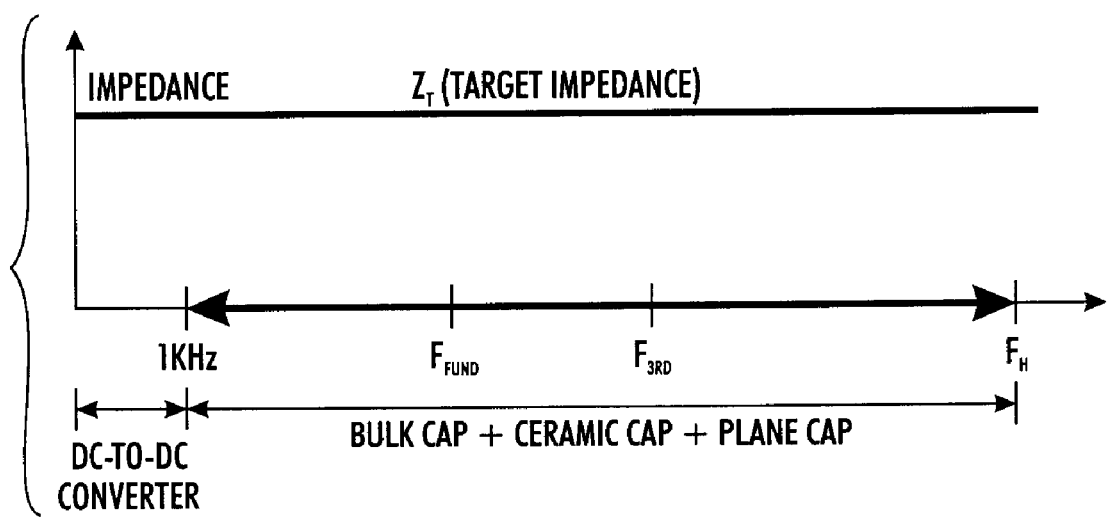
FIG. 4 shows an impedance vs. frequency plot used to assess whether a particular noise suppression design will sufficiently suppress noise.

In order to meet transient current demands and achieve suitable noise suppression, Z must not exceed the target impedance $Z_T$ for all of the frequencies of noise generated by the load. Thus, Z must consist of resistance for DC coupling, and capacitors for AC coupling. FIG. 4 shows a plot of impedance vs. frequency. The DC coupling and some AC coupling are provided by the DC-to-DC converter 100 that suppresses electronic noise from zero to hundreds of kilohertz. At higher frequencies, however, each clock signal causes noise at a fundamental frequency, $F_{FUND}$ and its harmonics, particularly $F_{3rd}$. Also, electronic switching transitions cause noise at even higher frequencies, $F_H$. These frequencies need to be suppressed.

Aspects of the disclosure provide methods and systems to design a distributed discrete capacitor bank incorporating power plane capacitance to concentrate the suppression of AC coupling to the frequencies caused by clocks and signal transition. Aspects of the disclosure provide a procedure for designing a distributed capacitor bank from a combination of bulk capacitors, ceramic capacitors and/or plane capacitance that provides the desired impedance Z to suppress noise at all desired frequencies.

Figure 5:
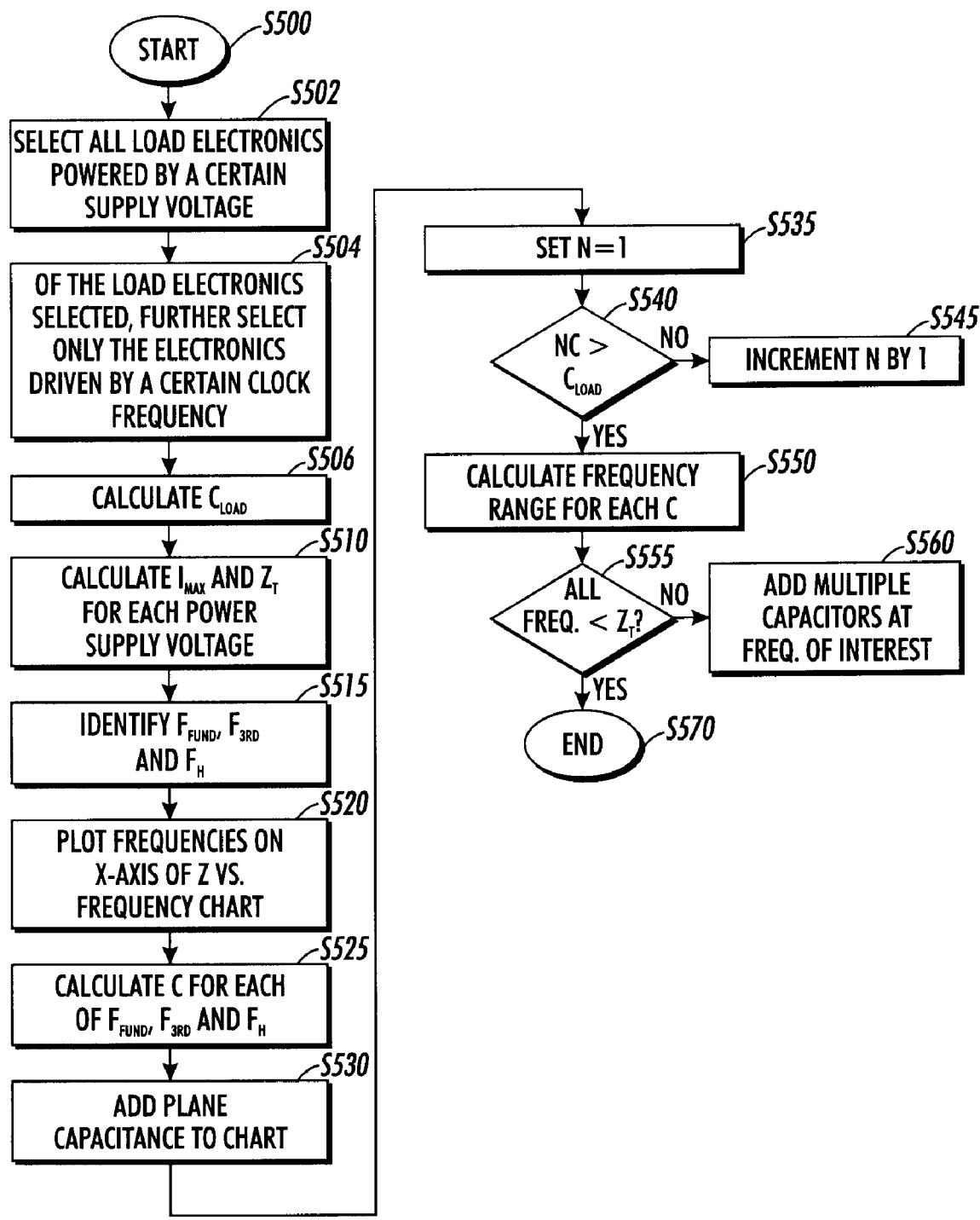
FIG. 5 shows a generalized flowchart of a process used to design a noise suppression circuit for a particular power supply in a printed wiring board assembly.

An exemplary basic procedure is provided below with reference to FIG. 5. The process starts at step S500. The process then proceeds to step 502 where a supply voltage, and all the connected load electronics powered by the supply voltage, are separated out for consideration. The process then proceeds to step 504 where, out of the electronics connected to the considered power supply and the clocks driving those electronics, a clock frequency and the electronics driven by that clock frequency are separated out for consideration. Note that a DC-to-DC converter may supply several power voltages and the load electronics may be driven by several clock frequencies. The procedure provided must be applied to each group of load electronics, grouped by supply voltage and clock frequency. The process then proceeds to step S506 where, for the group of electronics under consideration, a load capacitance $C_{LOAD}$ is calculated. From step S506, the process proceeds to step S510, where the maximum transient current $I_{MAX}$ and the target impedance $Z_T$ are calculated for the group of electronics under consideration. The target impedance will depend upon the maximum transient current drawn by the load from the supply voltage and the minimum voltage required by the load.

From step S510, flow advances to step S515 where various relevant frequencies to be suppressed are identified. The fundamental frequency of the noise, $F_{FUND}$, is equal to the clock frequency driving the load electronics. That frequency and its third harmonic, $F_{3rd}$, must be considered. There is also a high frequency, $F_H$, determined by examining the transition times of the signals in the load that must also be plotted for noise suppression.

From step S515, flow advances to step S520 where the frequencies $F_{FUND}$, $F_{3rd}$, and $F_H$ are plotted on the X-axis of an impedance vs. frequency plot or graph. Also plotted is the calculated target impedance, $Z_T$. From step S520, flow advances to step S525 where for each frequency on the x-axis, a capacitor component is chosen with a resonance frequency substantially equal to the frequency being considered. That is, capacitor components C1, C2, and C3 must be chosen for $F_{FUND}$, $F_{3rd}$, and $F_H$, respectively. These chosen capacitors are plotted on the chart.

From step S525, flow advances to step S530 where plane capacitance $C_{PLANE}$ is determined and plotted on the chart. Once a capacitor is found for each frequency, the capacitor's current load capability must be considered. At step S535, N is set to 1. At step S540, NC is compared to $C_{LOAD}$, where N is an integer multiplier. At step S540, NC is compared to $C_{LOAD}$. If a single component C is insufficient to handle $C_{LOAD}$, flow advances to step S545 where N is incremented. Multiples of a capacitor component C are assessed by steps S540 and S545 until the parallel sum of the capacitors hold enough charge to support the quick load current transients created by $C_{LOAD}$.

After all of the capacitors are determined in value and quantity, the impedance they supply over the frequency range is then considered at step S550. Each capacitor has its minimum impedance at a certain frequency, its resonant frequency. Above this frequency, the impedance rises until the next capacitor takes over. The impedance cannot be allowed to rise above the target impedance, $Z_T$. At step S555 it is determined whether all frequencies are below the target impedance $Z_T$. That is, do all capacitor values overlap below threshold $Z_T$ to suppress noise across the entire relevant frequency band. If so, the process ends at step S570. However, if not, flow advances to step S560 where additional quantities of capacitors are added for each frequency that does not meet the target impedance $Z_T$. This may require larger numbers of multiple capacitors for each frequency. The process then advances to step S570 where the process ends and the determined capacitor components and quantities provide a finalized distributed capacitor bank that when incorporated into the board result in a viable noise suppression system. It is possible that a contemplated design will have too many capacitors, which may crowd the physical space of the power plane. Accordingly, a balance should be achieved that provides both a low enough power system impedance and a number of capacitors the physical power plane can accommodate.

Figure 6:
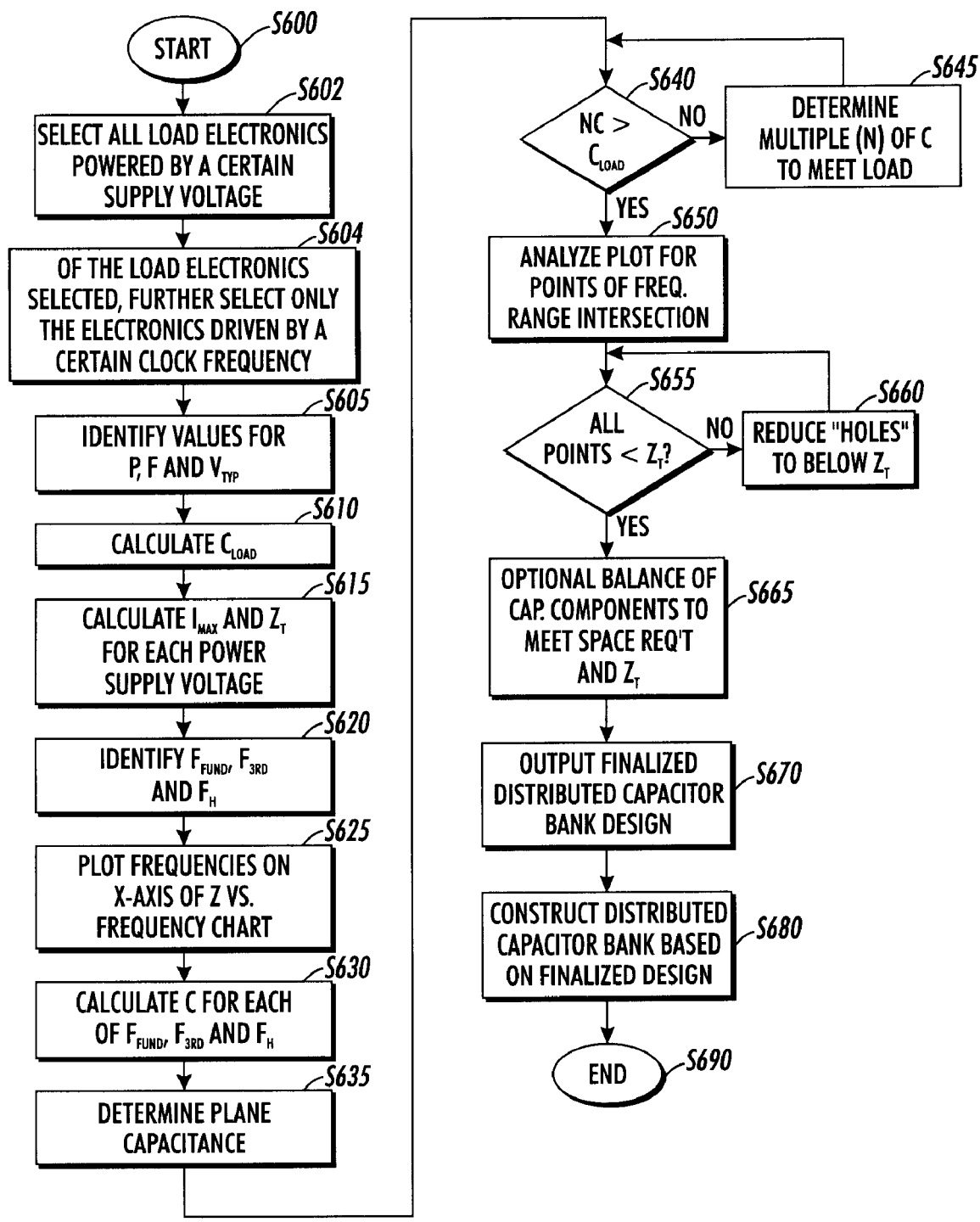
FIG. 6 shows an exemplary flowchart of a process used to design a noise suppression circuit for a particular power supply on a printed wiring board assembly.

A more specific process will be described with reference to FIG. 6. The process starts at step S600 and advances to steps S602, S604 and S605 where voltages and clock frequencies are considered or obtained. At step S605, various values are obtained. Flow then advances to step S610 where the load capacitance is calculated.

Each supply voltage $V_{DC}$ powers electronics driven by several clocks. Considering each power supply, for each clock frequency, the load capacitance is calculated. To find the load capacitance, the power consumption measurement is used. An electronic integrated circuit (IC) is driven with its maximum clock rates and gate usage. The ICs power pin voltage is set to the typical supply voltage level and the current into the pin is measured. The product of the power pin's voltage and current is the maximum power consumption.

Digital electronics specifications include the maximum power consumption P, the maximum operational clock frequency F, and the typical operating supply voltage for the load $V_{TYP}$. Each clock cycle, the capacitive loading of clock and signal level changes from low to high for an IC require a charge from the power supply of $Q=C_{LOAD}*V_{TYP}$, where $C_{LOAD}$ is the aggregate capacitance seen by the power supply when powering the electronic IC. This amount of charge is delivered each clock cycle constituting a current equal to $I=QF=C_{LOAD}*V_{TYP}*F$.

The power consumed by the electronics is: $P=I*V_{TYP}=C_{LOAD}*V_{TYP}^2*F$. Solving for the capacitance gives the equation to be used to find the load capacitance, $$C_{LOAD}=P/(F*V_{TYP}^2) \quad (1)$$

$C_{LOAD}$ must be found for each IC. If two ICs are driven at the same clock frequency, then they should be considered as one chip and the $C_{LOAD}$ values for those chips should be added together. Thus, the first step of the process (step S605) is to find the values for P, F, and $V_{TYP}$ from electronic specifications. Then, the process advances to step S610 where the load capacitance seen by the power supply is calculated using equation (1) and the $C_{LOAD}$ of each IC with the same clock frequency is added together. The load capacitance $C_{LOAD}$ needs to be found for each processor chip powered by the supply. This process must also be repeated for each power supply voltage.

From step S610, flow advances to step S615 where $I_{MAX}$ and $Z_T$ are determined for each power supply. The target impedance $Z_T$ is calculated by considering the voltage being supplied, the maximum transient current drawn by the load and the minimum operating supply voltage for the load. A DC-to-DC converter may supply several power voltages to a load. Each voltage supplied powers a certain set of electronics. For each set of electronics, a minimum operating supply voltage $V_{MIN}$ and minimum signal transition time from low to high, $t_r$, is provided within its specifications.

The maximum transient current, $I_{MAX}$, required to charge $C_{LOAD}$ from 0 volts to the typical power supply voltage level in time $t_r$ is $$I_{MAX}=C_{LOAD}*V_{TYP}/t_r \quad (2)$$

In reality, not all signals transition during the transition time of the clock, but are dispersed across the clock cycle. Thus, the maximum actual transient current is actually much less than the calculated worst-case scenario. Based on knowledge of the applicable design and design experience, typically no more than 50% of all signal transitions occur at the same time. Accordingly, the calculated Imax in equation (2) may be reduced to yield a new value, $I_{max}$, to be used in further calculations equal to $I_{max}=\alpha I_{MAX}$, where $\alpha$ is equal to 50% or another percentage determined appropriate for the design under consideration to provide a typical expected maximum transient current.

Figure 3:
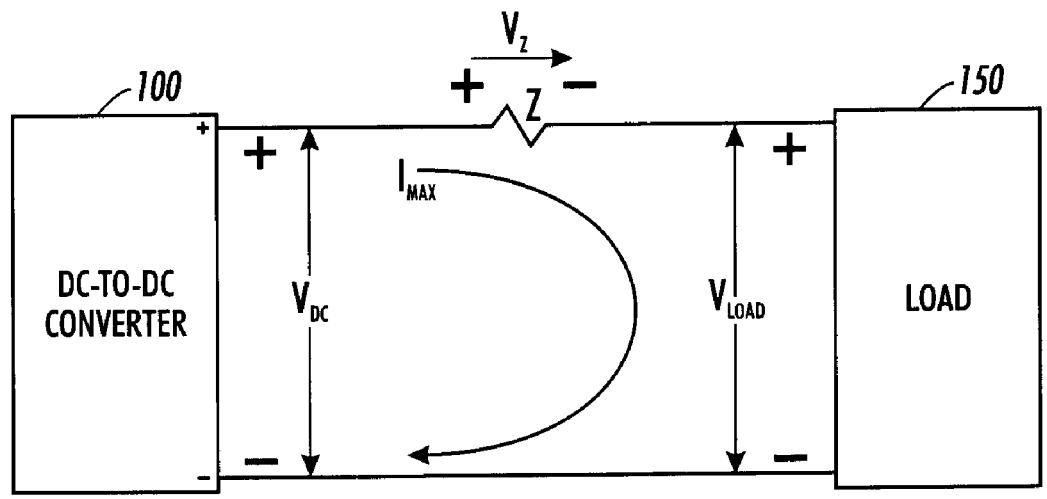
FIG. 3 shows a diagrammatic representation of a sub-system power, load and target impedance.

Referring to FIG. 3, the supply voltage is $V_{DC}=Z_T*I_{max}+V_{MIN}$. Solving for the impedance $Z_T$ yields:

$$Z_T=(V_{DC}-V_{MIN})/I_{max} \quad (3)$$

Thus, step S615 uses the values for $C_{LOAD}$, $t_r$, and $V_{MIN}$ to calculate the $I_{MAX}$ using equation (2) and solves for the target impedance, $Z_T$, using equation (3). The load capacitance and target impedance need to be found for each power supply voltage provided by the DC-to-DC converter. Furthermore, for each power supply voltage may drive electronics running at different frequencies and hence requiring different load capacitance and target impedances for each frequency.

From step S615, flow advances to step S620 where frequencies of interest are identified. The fundamental frequency of the electronics noise $F_{FUND}$ is the clock rate frequency of the electronics. Hence, $$F_{FUND}=F \quad (4)$$

The third harmonic of the fundamental frequency, $F_{3rd}$, is:

$$F_{3rd}=3*F \quad (5)$$

The high frequency is determined by examining the transition times of the load electronics. If the rising edge transition time is $t_r$, and the falling edge transition time is $t_f$, then the high frequency is equal to:

$$F_H=0.35/t_r \quad (6)$$

or $$F_H=0.35/t_f \quad (7)$$

whichever yields the higher frequency, $F_H$.

Thus, the next part of the process is to find the fundamental frequency of the noise $F_{FUND}$ generated by the electronics using equation (4), find the third harmonic $F_{3rd}$ of each fundamental frequency using equation (5), and find the high frequency $F_H$ using equations (6) and (7).

Figure 7:
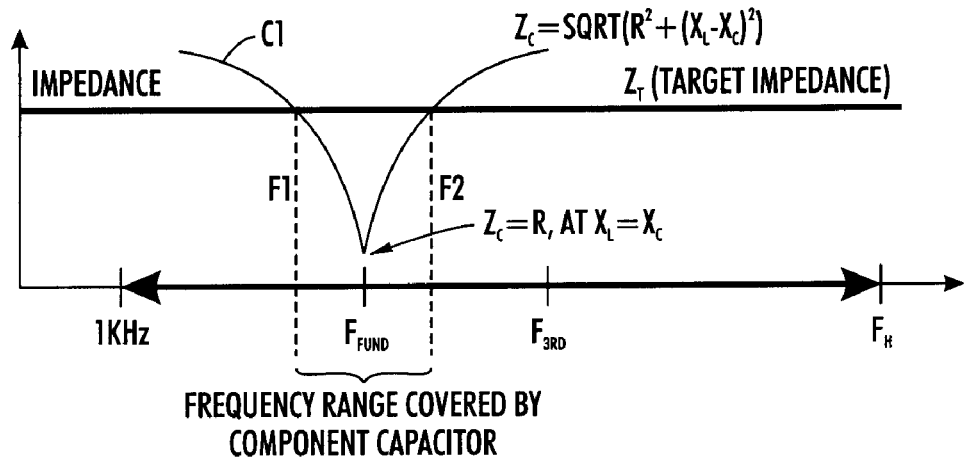
FIG. 7 shows the impedance vs. frequency plot of FIG. 4 with a first capacitor component C1 added to suppress the fundamental frequency $F_{FUND}$ of the power supply system.

With the above frequencies calculated, consideration of how to design the target impedance over the range of frequencies is facilitated in step S625 by plotting the frequencies on an Impedance vs. Frequency chart as shown in FIGS. 4 and 7. The target impedance $Z_T$ is also plotted on the graph. The DC-to-DC converter suppresses noise at frequencies from 0 to 1000 Hertz. The plane capacitance $C_{PLANE}$ handles the higher frequencies. However, discrete bulk capacitors and/or ceramic capacitors are needed to suppress all the higher frequency ranges covering $F_{FUND}$, $F_{3rd}$, and $F_H$ frequencies. FIG. 7 considers only one power supply voltage and its associated $F_{FUND}$, $F_{3rd}$, and $F_H$ frequencies arising from a clock frequency. Additional $F_{FUND}$, $F_{3rd}$, and $F_H$ frequencies must be plotted for each power supply voltage and clock frequency.

Thus, the next step in this process is to draw or otherwise graph the impedance vs. frequency chart including identification of the $F_{FUND}$, $F_{3rd}$, and $F_H$ frequencies for each power supply voltage.

Figure 8:
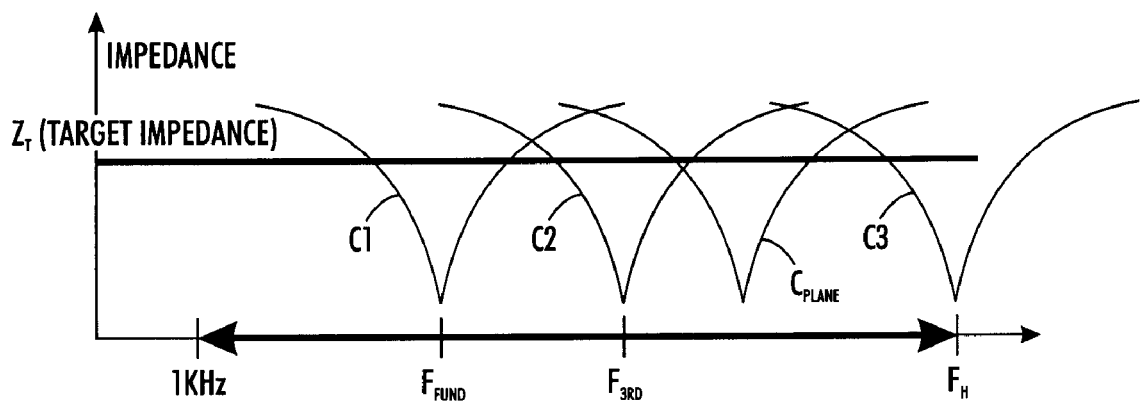
FIG. 8 shows the impedance vs. frequency plot of FIG. 7 with second and third capacitor components C2 and C3 added to the plot that suppress the third harmonic frequency $F_{3rd}$ and high frequency component $F_H$, as well as plotting of the plane capacitance $C_{PLANE}$.

For each frequency plotted in the impedance vs. frequency chart, a capacitor component C must be chosen to suppress that particular frequency. Thus, as shown in FIG. 8, a capacitor C1, C2 and C3 for each of $F_{FUND}$, $F_{3rd}$, and $F_H$, respectively, is identified at step S630. Effective suppression is achieved when the capacitor component has its lowest impedance at that frequency. A capacitor component has a designed capacitance and a parasitic series inductance and parasitic series resistance. Thus, the total impedance of a capacitor component is: $Z_C=\sqrt{R^2+(X_L-X_C)^2}$ where R is the parasitic series resistance, $X_L$ is the parasitic series inductor's reactance, and $X_C$ is the designed capacitor's reactance. The parasitic series resistance is given in the specifications for capacitor components. The parasitic series inductor's reactance $X_L$ and the designed capacitor's reactance $X_C$ vary with frequency and are equal to:

$$\text{Inductive reactance } (\Omega)=X_L=2\pi fL \quad (8)$$

$$\text{Capacitive reactance } (\Omega)=X_C=1/(2\pi fC) \quad (9)$$

where f is the frequency under consideration, C is the capacitance value, and L is the inductance value given in the capacitor component specification. Once calculated at a frequency, the inductive reactance and capacitive reactance are referred to as the "equivalent series inductance" and the "equivalent series resistance" of the capacitor component. Finding an appropriate capacitor for a frequency consists of finding a capacitor component for which $Z_C$ is minimum at that frequency. Values of suitable capacitor components can be found in available product specifications and may be entered or stored in a table, lookup or relational database form. For example, see capacitor component C1 in FIG. 7 identified for $F_{FUND}$. The frequency at which $Z_C$ is at its minimum value is where $X_L$ equals $X_C$, so $Z_C=R$.

Using equations (8) and (9), $f_r=1/(2\pi\ sqrt(LC))$. Solving for C results in:

$$C=1/(sqrt((2\pi)^2 L f_r^2)) \qquad (10)$$

where $f_r$ is referred to as the resonant frequency of the capacitor. The frequency range for which a capacitor provides impedance below the target impedance is defined by the "low frequency" F1 and the "high frequency" F2 as shown in FIG. 7. F1 is the frequency where the capacitive reactance of the capacitor becomes less than the target impedance $Z_T$. Using equation (8) and solving for the frequency F1 gives:

$$F1=1/(2\pi C Z_T) \qquad (11)$$

Similarly, F2 can be found using equation (9) and solved giving:

$$F2=Z_T/2\pi L \qquad (12)$$

F2 should be greater than the frequency being suppressed and the frequency being suppressed should be greater than F1. If not, the number of component capacitors should be increased until this condition is met.

One particular method for calculation of a capacitor component C in step S630 is achieved by collecting the series inductance values for a number of capacitor components and finding an average inductance value for the physical case size of the inductors. Then, using the resonant frequency $f_r$ and the average inductance, the capacitor value is calculated using equation (10). The inductor value of the capacitor value just calculated is then checked to ensure that it is sufficiently close to the average inductance used for calculation. If not, the above is repeated using an inductor value of the capacitor value just calculated.

Once a capacitor component is found, low and high frequencies F1 and F2 of each capacitor component C are calculated using equations (11) and (12), including confirming whether the frequency under consideration is greater than F1 but lower than F2. If not, the number of capacitors used is increased until this condition is true. These steps are repeated for each frequency $F_{FUND}$, $F_{3rd}$, and $F_H$ under consideration. The capacitor components obtained from these steps will have their resonant frequencies at the $F_{FUND}$, $F_{3rd}$, and $F_H$ frequencies, but their values will probably be too small to handle the current required by the electronics.

Not only are the capacitor components C included in the impedance vs. frequency chart, but the plane capacitance should be as well. Although the plane capacitance cannot be readily adjusted, its inherent capacitance may be useful in noise suppression and should be included in the calculations to assess whether sufficient noise suppression below $Z_T$ is achieved. Accordingly, the process proceeds from step S630 to step S635 where the plane capacitance is determined and plotted on the impedance vs. frequency chart.

To plot the plane capacitance, its capacitance, parasitic inductance and parasitic resistance must be calculated. The plane's capacitance is dependent on the materials used and the spacing, d, and area, A, of the plane. The plane capacitance $C_{PLANE}$ is given by:

$$C_{PLANE}=\epsilon r\ \epsilon 0 * A/d \qquad (13)$$

where for FR4 materials, $\epsilon r=4.1$, $\epsilon 0$ is the fundamental electric constant equal to 8.854 187 817 ... $\times 10^{-12}$ F m$^{-1}$ and A is a determinable percentage, such as 70%, of the plane cap area due to the via holes in the plane. That is, because of the via holes in the material for mounting of components, the effective surface area of the material is reduced by an amount of the removed surface area.

The resonant frequency of plane capacitance, $Fr_{PLANE}$ is:

$$Fr_{PLANE}=1/(2\pi * sqrt(LC)) \qquad (14)$$

where L is found from the inductance per unit length and the geometry of the power plane. Table 1 below gives the per area values for inductance and capacitance for FR4 materials of various thicknesses.

TABLE 1

| Dielectric Thickness (mil) | Inductance (pH/Square) | Capacitance (pF/in$^2$) |
|---|---|---|
| 4 | 130 | 225 |
| 2 | 65 | 450 |
| 1 | 32 | 900 |

The calculated inductance is referred to as the "equivalent series inductance" (ESL). Similarly, the "equivalent series resistance" (ESR) needs to be calculated. The ESR of the plane capacitance can be calculated as follows:

$$R=(\rho/t)(L/W)(\Omega) \qquad (15)$$

where $\rho$ is the resistivity of copper (0.0172$\Omega$), t is the copper thickness, L is the length of copper plane, and W is the width of copper plane.

The inclusion of the plane capacitance is illustrated in FIG. 8. The plane capacitance resonant frequency does not necessarily match up with any noise frequency, but may likely provide additional noise suppression over part of the frequency range as shown.

Thus, one exemplary method to determine and plot plane capacitance $C_{PLANE}$ is by calculating the plane capacitance using equation (13). Then, the equivalent series inductance ESL is calculated using table 1 and the equivalent series resistance ESR is calculated using equation (15). From this, the resonant frequency of the plane capacitance is calculated using equation (14) and plotted on the impedance vs. frequency plot in the same way as done for the capacitor components.

From step S635, the process advances to step S640 where each capacitor component is examined to determine whether it can supply the transient current required by the electronics. If not, flow advances to step S645 where it is determined what multiple number of the components must be placed in parallel until the sum of the capacitor component values is sufficient to handle the transient current. This condition is met when the sum of the capacitor component values is about 0.6 to 1.2 times the load capacitance $C_{LOAD}$ of the electronics being driven. $C_{LOAD}$ is calculated using equation (1). The number of parallel capacitor components, N, needed is:

$$N=nC_{LOAD}/C \qquad (16)$$

where n is a the scalar mentioned above and has a value of about 0.6 to 1.2. This calculation is performed for each capacitor component value C. Thus, step S645 uses equation (16) to calculate the number of capacitor components to join in parallel to supply the transient current to the electronics.

Figure 9:
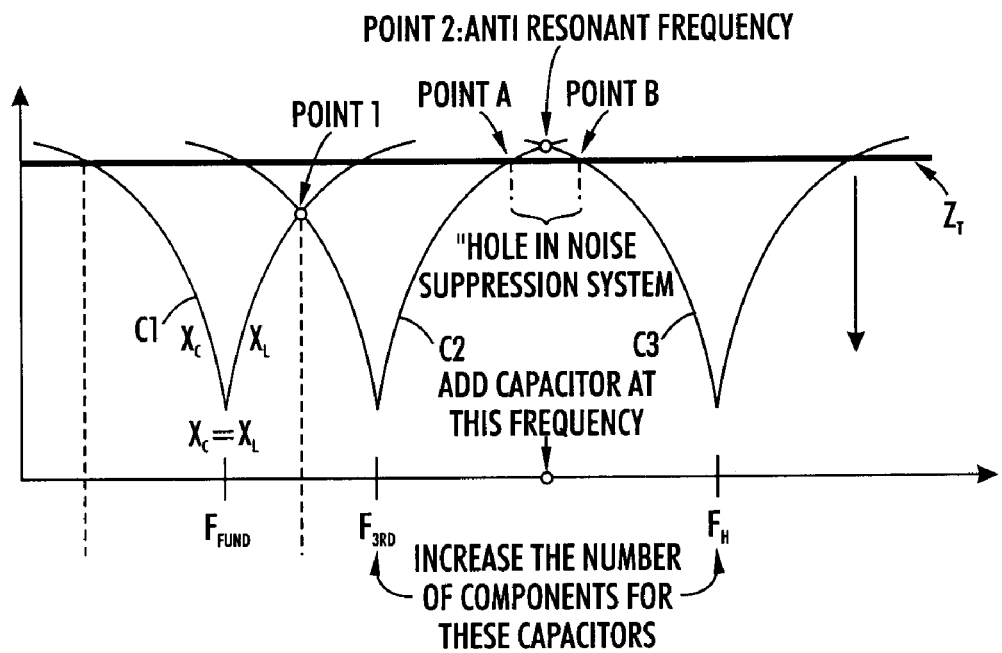
FIG. 9 shows an exemplary impedance vs. frequency plot showing the frequencies suppressed by capacitor components C1, C2 and C3 and an identified "hole" in noise suppression coverage from an initial design.

If the determination in step S640 is yes, or upon completion of step S645, flow advances to step S650 where the plotted capacitor component frequency ranges are compared for intersection points between the plots, as shown in FIG. 9. Point 1 is such an intersection. All such intersections must occur below the target impedance $Z_T$ in order for the collective decoupling effect of the capacitors to effectively suppress noise and satisfy transient current levels. If an intersection occurs above the target impedance, as with Point 2, an anti-resonant frequency is created. The anti-resonant frequency is a point of high impedance. That is, a "hole" in the noise suppression design of the power system bounded by the points where the impedance of two adjacent capacitor components increase above the target impedance $Z_T$ (Points A and B in FIG. 9).

At step S655 it is determined whether all such intersecting points are below threshold $Z_T$. If so, then an effective noise suppression design has been formulated and flow advances to step S665. If not, flow advances to step S660 where any "holes" are closed by bringing the point, such as Point 2, below the target impedance $Z_T$.

One way to do this is by increasing the number of parallel capacitor components, N, for one or both the capacitor components involved. That is, the intersecting capacitor components, which as illustrated in FIG. 9 are capacitors C2 and C3, are increased in number. As shown in representative FIG. 10, the impedance curves for the capacitors involved lower by the addition of multiple capacitor components at these frequencies and the anti-resonant point, Point 2 as shown, falls below the target impedance.

Figure 11:
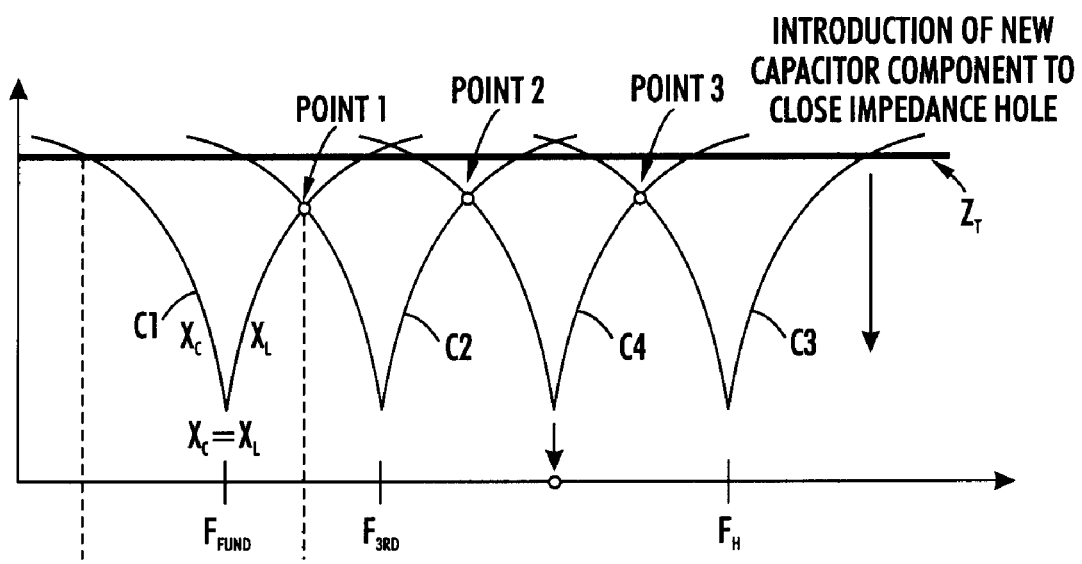
FIG. 11 shows a second method of "hole" suppression in which a new capacitor component C4 is added to close the noise suppression "hole".

Another way to eliminate the hole at step S660, which is new and novel, is to introduce a new capacitor component that has a resonant frequency substantially equal to the anti-resonant frequency. This can be determined in the same manner as used to identify capacitor components for $F_{FUND}$ and other harmonic frequencies. As seen in FIG. 11, the addition of another capacitor component C4 eliminates the prior intersection Point 2 and creates new intersections at Points 2 and 3, both of which are below the target impedance $Z_T$ and fill the "hole" to fully suppress the power system noise.

Figure 10:
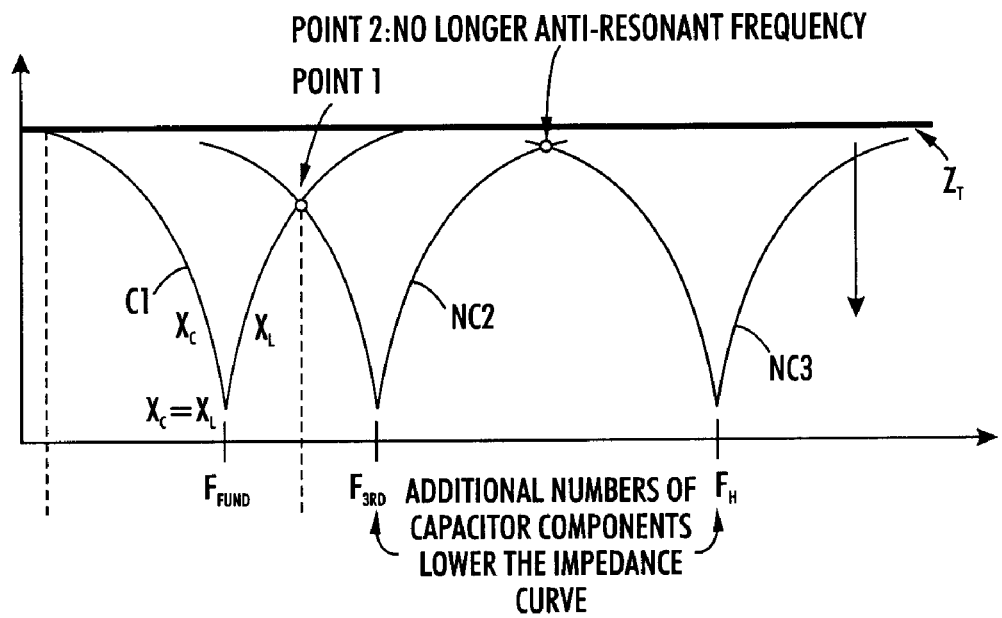
FIG. 10 shows a first method of "hole" suppression in which addition numbers of capacitor components C2 and C3 have been added to lower the impedance curve until the "hole" has been suppressed.

Thus, these latter steps of the process plot each capacitor impedance on the impedance vs. frequency chart showing intersection points between capacitor values as in FIG. 9, identify any anti-resonant frequencies ("holes") as in FIG. 9, and either increase N for one or both of the capacitor components involved or introduce new capacitors with resonant frequencies at the anti-resonant frequencies until all anti-resonant frequencies are eliminated, as illustrated in FIGS. 10-11. Once all anti-resonant frequencies are eliminated, flow advances to step S670 where a finalized distributed capacitance bank design is outputted, the design consisting of the identified capacitor components and quantities. This output can take several forms, including output of a suitable representation of the design in table form, diagram form, specification or parts list with quantities, or other displayable or printable output form useful to prepare construction of an actual distributed capacitance bank from the outputted information.

Although not necessarily needed, a preferred embodiment provides a final part of this procedure to form a balance between the number of capacitor components N and any physical limitations of the system. Because there is only a finite space available on the printed wiring board assembly for actual electrical load components and any noise suppression components, such as a discrete distributed capacitor bank, it may become necessary to balance needs. If the number of capacitor components exceeds the space available for placement, the number of capacitor components N must be adjusted until both the physical and electrical conditions are met.

Thus, an optional step of the process prior to finalization of the design is step S665 where the physical space available for each set of capacitor components is evaluated, the number of capacitor components the physical space can accommodate is evaluated, and N is increased or decreased for one or more capacitor components or new capacitors are added until no anti-resonant frequencies are present and all capacitor components fit within the physical space available. One example of this would be if the methodology of FIG. 10 resulted in too many capacitive components being needed. In such a case, the alternative methodology of FIG. 11 could be pursued instead, with the identification of a new capacitor component for each anti-resonant frequency. In this case, the number of capacitor components would be decreased until physical space limitations are alleviated, and even further to provide space for some additional capacitor components. Considering the reduced number of capacitor components, the frequency vs. impedance chart would then be analyzed for any anti-resonance points. For any anti-resonance points, a new capacitor component value would be introduce in sufficient number as to eliminate the anti-frequency point. As the new capacitor components introduce low impedance at the anti-resonant frequencies, it is strongly effective at erasing the anti-resonant point. Furthermore, as the new capacitor does not have to supply current for load electronics, it does not have to appear in such large numbers as component capacitors suppressing frequencies Ffund, F3rd and Fh.

Performing the processes described above with reference to FIG. 5 or 6 result in a sub-system power system noise suppression design that can efficiently and effectively achieve desirable results at step S670 theoretically, without the need for trial-and-error product configurations and physical testing of several potential actual capacitor banks to determine compliance from EMI and signal integrity viewpoints. Once the theoretical design is formulated, the final acceptable design can be constructed based on the finalized design at step S680 and tested for actual compliance. The process then ends at step S690.

The above procedure provides an improved method for design of a power supply system to meet system integrity and electromagnetic interference regulations and standards. The method focuses on determining a target impedance, placing capacitor components that have maximum clamping at noisy frequencies, and holding the impedance below the target impedance.

This procedure contains both calculations and decision making processes. The calculations and processes outlined may be implemented manually or may be partially or fully automated by entering various calculations and specification data for variables using conventional input devices, such as a keypad, keyboard, mouse, pointer, upload of saved files, etc. into a spreadsheet program such as Microsoft Excel. However, the method may be implemented on a programmed general purpose computer. It may also be implemented on a special purpose computer, such as a graphing calculator, a programmed microprocessor or microcontroller and peripheral integrated circuit element, an ASIC, or other integrated circuit, a digital signal processor, a hard-wired electronic or logic circuit such as a discreet element circuit, a programmable logic device such as a PLD, PLA, FPGA, PAL, or the like. In general, any device capable of implementing a finite state machine that is in turn capable of implementing the flowcharts shown in FIGS. 5-6 can be used to implement the process.

However, the disclosed process may also be readily implemented in software using object or object-oriented software development environments that provide portable source code that can be used on a variety of computer, workstation and/or personal digital assistant hardware platforms. For example, the entire procedure could be implemented in a programming language, such as Visual C++. Various input data to the program could be either entered manually or downloaded into a database or lookup table based on manufacture specifications as explained in the above procedure. Decision loops yields a program that performs the process steps and calculations in FIGS. 5 or 6 to design components for a distributed capacitive bank with which the DC-to-DC converter and power plane capacitance hold the power system impedance below a designed target impedance for all frequencies. Any current transients that would otherwise tax the power source are well managed by the power system design described herein.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A method for designing a distributed capacitor bank for a power supply system to suppress noise below a target impedance $Z_T$, where multiple power supplies and multiple clock frequencies may be provided on the board and the method steps are repeated for each power supply voltage and clock frequency combination, comprising:

grouping electrical circuits on the board into groups that are powered by the same power supply voltage and driven at the same clock frequency and for each group;

determining an aggregate capacitance $C_{LOAD}$ for the group;

determining a maximum transient current $I_{MAX}$ generated by the group of electronics powered by the same power supply voltage and driven at the same clock frequency;

determining a target impedance $Z_T$ required of the power supply voltage for suppression of noise from the group of electronics powered by that power supply voltage and driven at the same clock frequency;

identifying a fundamental frequency $F_{FUND}$ corresponding to the clock frequency, the third harmonic $F_{3rd}$, and a high frequency noise $F_H$ correlated to an edge transition time;

plotting the identified frequencies on an impedance vs. frequency chart along with the target impedance $Z_T$;

determining a capacitor component C1, C2 and C3 with a frequency corresponding to each of the frequencies $F_{FUND}$, $F_{3rd}$, and $F_H$ and plotting capacitors C1, C2 and C3 onto the impedance vs. frequency chart;

determining the plane capacitance $C_{PLANE}$ for the particular board material used for the power supply and electrical circuit and plotting $C_{PLANE}$ on the impedance vs. frequency chart;

determining the multiples of C1, C2 and/or C3 needed to support the capacitance $C_{LOAD}$;

analyzing intersecting points of the capacitor component frequency plots for C1, C2, C3 and $C_{PLANE}$ to determine whether all intersecting points occur below the target impedance $Z_T$; and determining that a distributed capacitor bank from the identified capacitor components is viable to suppress noise in the power supply below threshold $Z_T$ if all intersecting points occur below target impedance $Z_T$ and if all intersecting points are not below the target impedance retaining capacitor components, C1, C2 and C3 in any subsequent iterative determination of additional capacitor components.

2. The method according to claim 1, further comprising outputting a finalized distributed capacitor bank design.

3. The method according to claim 2, further comprising constructing a physical distributed capacitor bank for the power supply voltage using the identified capacitor components of the finalized design.

4. The method according to claim 1, wherein multiple power supplies and multiple clock frequencies are provided on the board and the method steps are repeated for each power supply voltage and clock frequency combination.

5. The method according to claim 1, wherein $C_{LOAD}=P/(F*V_{TYP}^2)$, where P is the maximum power consumption of the power supply, F is the maximum operational clock frequency, and VTYP is the typical operating supply voltage for the load.

6. The method according to claim 1, wherein the target impedance $Z_T=(V_{DC}-V_{MIN})/I_{MAX}$.

7. The method according to claim 1, wherein the maximum transient current $I_{MAX}$ required to charge $C_{LOAD}$ from 0 volts to the typical power supply voltage level $V_{TYP}$ in a minimal transition time $t_r$ is $I_{MAX}=C_{LOAD}*V_{TYP}/t_r$.

8. The method according to claim 1, wherein the high frequency $F_H$ is determined by examining the transition times of the load electronics and is the higher frequency of $F_H=0.35/t_r$ or $F_H=0.35/t_f$, where $t_r$ is the rising edge transition time and $t_f$ is the falling edge transition time.

9. The method according to claim 1, wherein $C=1/(\text{sqrt}((2\pi)^2 L f_r^2))$, $f_r$ being the resonant frequency of the capacitor and L being the average inductance of the capacitor.

10. A computer readable medium containing a program that when executed by a computer performs the following program instructions for designing a distributed capacitor bank for a power supply board where multiple power supplies and multiple clock frequencies may be provided on the board and the program instructions are repeated for each power supply voltage and clock frequency combination to suppress noise below a target impedance $Z_T$, the program instructions comprising:

determining an aggregate capacitance $C_{LOAD}$ for each group of electrical circuits on the board driven by the same power supply voltage at a same clock frequency;

determining a maximum transient current $I_{MAX}$ for the at least one power supply;

determining a target impedance $Z_t$ for the at least one power supply;

identifying a fundamental frequency $F_{FUND}$ corresponding to the clock rate, the third harmonic $F_{3rd}$, and a high frequency noise $F_H$ correlated to an edge transition time;

plotting the identified frequencies on an impedance vs. frequency chart along with the target impedance $Z_T$;

determining a capacitor component C1, C2 and C3 with a frequency corresponding to each of the frequencies $F_{FUND}$, $F_{3rd}$, and $F_H$ and plotting capacitors C1, C2 and C3 onto the impedance vs. frequency chart;

determining the plane capacitance $C_{PLANE}$ for the particular board material used for the power supply and electrical circuit and plotting $C_{PLANE}$ on the impedance vs. frequency chart;

determining the multiples of C1, C2 and/or C3 needed to support the capacitance $C_{LOAD}$;

analyzing intersecting points of the capacitor component frequency plots for C1, C2, C3 and $C_{PLANE}$ to determine whether all intersecting points occur below the target impedance $Z_T$; and outputting a determination that a distributed capacitor bank from the identified capacitor components is viable to suppress noise in the power supply below threshold $Z_T$ if all intersecting points occur below target impedance $Z_T$ and if all intersecting points are not below the target impedance retaining capacitor components, C1, C2 and C3 in any subsequent iterative determination of additional capacitor components.

11. The computer readable medium according to claim 10, wherein multiple power supplies are provided on the board and the program repeats the process for each power supply voltage and clock frequency combination.

12. The computer readable medium according to claim 10, further comprising means for outputting a finalized distributed capacitor bank design.

13. The computer readable medium according to claim 10, wherein $C_{LOAD}=P/(F*V_{TYP}^2)$, where P is the maximum power consumption of the power supply, F is the maximum operational clock frequency, and $V_{TYP}$ is the typical operating supply voltage for the load.

14. The computer-executable program according to claim 10, wherein the target impedance $Z_T=(V_{DC}-V_{MIN})/I_{MAX}$.

15. The computer-executable program according to claim 10, wherein the maximum transient current $I_{MAX}$ required to charge $C_{LOAD}$ from 0 volts to the typical power supply voltage level $V_{TYP}$ in a minimal transition time $t_r$ is $I_{MAX}=C_{LOAD}*V_{TYP}/t_r$.

16. The computer-executable program according to claim 10, wherein the high frequency $F_H$ is determined by examining the transition times of the load electronics and is the higher frequency of $F_H=0.35/t_r$ or $F_H=0.35/t_f$, where $t_r$ is the rising edge transition time and $t_f$ is the falling edge transition time.

17. The computer-executable program according to claim 10, wherein $C=1/(\sqrt{(2\pi)^2 L f_r^2})$, $f_r$ being the resonant frequency of the capacitor and L being the average inductance of the capacitor.

18. A system for designing a distributed capacitor bank for a power supply board to suppress noise below a target impedance $Z_T$, comprising:

an input device for receiving input variables;

a processor that uses the received input variables to identify a viable distributed capacitor bank design, the processor including;

means for determining an aggregate capacitance $C_{LOAD}$ for each electrical circuit on the board driven by the same power supply voltage at a same clock frequency;

means for determining a maximum transient current $I_{MAX}$ for the at least one power supply;

means for determining a target impedance $Z_T$ for the at least one power supply;

means for identifying a fundamental frequency $F_{FUND}$ corresponding to the clock rate, the third harmonic $F_{3rd}$, and a high frequency noise $F_H$ correlated to an edge transition time;

means for plotting the identified frequencies on an impedance vs. frequency chart along with the target impedance $Z_T$;

means for determining a capacitor component C1, C2 and C3 with a frequency corresponding to each of the frequencies $F_{FUND}$, $F_{3rd}$, and $F_H$ and plotting capacitors C1, C2 and C3 onto the impedance vs. frequency chart;

means for determining the plane capacitance $C_{PLANE}$ for the particular board material used for the power supply and electrical circuit and plotting $C_{PLANE}$ on the impedance vs. frequency chart;

means for determining the multiples of C1, C2 and/or C3 needed to support the capacitance $C_{LOAD}$;

means for analyzing intersecting points of the capacitor component frequency plots for C1, C2, C3 and $C_{PLANE}$ to determine whether all intersecting points occur below the target impedance $Z_T$;

means for outputting a determination that a distributed capacitor bank from the identified capacitor components is viable to suppress noise in the power supply below threshold $Z_T$ if all intersecting points occur below target impedance $Z_T$ and if all intersecting points are not below the target impedance retaining capacitor components, C1, C2 and C3 in any subsequent iterative determination of additional capacitor components; and an output device for outputting a finalized distributed capacitor bank design.

* * * * *